US009054294B2

(12) United States Patent
Haskett

(10) Patent No.: US 9,054,294 B2
(45) Date of Patent: Jun. 9, 2015

(54) SOFT MECHANICAL STOPS TO LIMIT OVER-TRAVEL OF PROOF MASSES IN CANTILEVERED PIEZOELECTRIC DEVICES

(71) Applicant: TEXAS INSTRUMENTS INCORPORATED, Dallas, TX (US)

(72) Inventor: Bradley M. Haskett, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 333 days.

(21) Appl. No.: 13/647,279

(22) Filed: Oct. 8, 2012

(65) Prior Publication Data
US 2013/0088123 A1 Apr. 11, 2013

Related U.S. Application Data

(60) Provisional application No. 61/543,888, filed on Oct. 6, 2011.

(51) Int. Cl.
*H01L 41/08* (2006.01)
*H01L 41/053* (2006.01)
*H01L 41/113* (2006.01)

(52) U.S. Cl.
CPC .......... *H01L 41/053* (2013.01); *H01L 41/1136* (2013.01)

(58) Field of Classification Search
CPC ...... H01L 41/094; H01L 41/113; H02N 2/18; H02N 2/186

USPC .......................................... 310/330–332, 339
See application file for complete search history.

(56) References Cited

U.S. PATENT DOCUMENTS

| | | | | |
|---|---|---|---|---|
| 6,111,338 A * | 8/2000 | Otsuchi et al. | ................ | 310/352 |
| 7,245,062 B2 * | 7/2007 | Schmidt | ........................ | 310/330 |
| 7,511,404 B2 * | 3/2009 | Lee | ................ | 310/339 |
| 7,692,365 B2 * | 4/2010 | Churchill et al. | ............. | 310/339 |
| 8,072,122 B2 * | 12/2011 | Gao et al. | ...................... | 310/339 |
| 8,174,168 B2 * | 5/2012 | Nakamura et al. | ............ | 310/339 |
| 8,222,754 B1 * | 7/2012 | Soliman et al. | ................ | 290/1 R |
| 2009/0015103 A1 * | 1/2009 | Rastegar et al. | ............. | 310/328 |
| 2009/0211353 A1 * | 8/2009 | Gao et al. | ...................... | 73/146.5 |
| 2011/0140579 A1 * | 6/2011 | Moon et al. | ................... | 310/339 |
| 2011/0168929 A1 * | 7/2011 | Buestgens et al. | ........ | 251/129.01 |
| 2013/0049539 A1 * | 2/2013 | Lee et al. | ...................... | 310/339 |
| 2013/0207520 A1 * | 8/2013 | Near | ............................. | 310/339 |

FOREIGN PATENT DOCUMENTS

| | | | | |
|---|---|---|---|---|
| EP | 2113953 A1 * | 11/2009 | ............ | H01L 41/113 |
| EP | 2184791 A1 * | 5/2010 | ............ | H01L 41/113 |
| WO | WO 0135470 A1 * | 5/2001 | | |
| WO | WO 2010149503 A1 * | 12/2010 | | |
| WO | WO 2011021548 A1 * | 2/2011 | | |

* cited by examiner

*Primary Examiner* — J. San Martin
(74) *Attorney, Agent, or Firm* — Jacqueline J. Garner; Frank D. Cimino

(57) ABSTRACT

A piezoelectric device is disclosed which has a built-in soft stop which serves for protection against excessive force.

22 Claims, 4 Drawing Sheets

SOFT MECHANICAL STOPS TO LIMIT OVER-TRAVEL OF PROOF MASSES IN CANTILEVERED PIEZOELECTRIC DEVICES

This application claims the benefit of Provisional Application No. 61/543,888, filed Oct. 6, 2011, the entirety of which is hereby incorporated by reference.

BACKGROUND

This relates to the field of piezoelectric devices and, in particular, to piezoelectric cantilever devices.

Piezoelectric materials may be used to generate electrical energy when strain is applied to the piezoelectric material by external forces or vibrations. This electrical energy may be harnessed, for example, to charge a battery when the piezoelectric material is used to fabricate a piezoelectric generator or the electrical energy may be used, for example, to measure an applied force or to trigger the deployment of an automobile air bag when the piezoelectric material is used to fabricate an accelerometer sensor.

In many piezoelectric generator and sensor applications, a cantilever structure such as illustrated in FIGS. 1 and 2 is utilized.

In the example cantilever piezoelectric device illustrated in FIG. 1 the cantilever bar 24 is formed from a piezoelectric material which when flexed, generates an electrical voltage. An end of the piezoelectric bar 24 may be attached to the package 20 by support post 22. A proof mass 26 may be attached to the piezoelectric bar 24 to increase the amount of flex or strain to the piezoelectric bar when a force is applied to the package. A package lid 28 may seal the piezoelectric device into the package 20.

In the example cantilevered piezoelectric device illustrated in FIG. 2, the piezoelectric material 30 is sandwiched between a bottom electrode 32 and a top electrode 34. The bottom electrode 32, the top electrode 34, and the piezoelectric material 30 forms the cantilever piezoelectric device. As in the previous device, proof masses 26 may be attached to the cantilever to increase the amount of stress applied to the piezoelectric material 30 when a force is applied to the piezoelectric device. Lower support post 22 may attach an end of the lower electrode 32 to the package 20 and the upper support post 36 may attach a corresponding end of the upper electrode 34 to the package 20 or to a package lid 38.

The piezoelectric material is typically a ceramic material which may break causing the device to fail if too much force is applied. For example, the cantilever arm 24 in FIG. 1 may break if the piezoelectric device in FIG. 1 is dropped. Similarly the piezoelectric material 30 in FIG. 2 may crack causing the piezoelectric device to fail if the cantilever flex is excessive.

SUMMARY

A piezoelectric device is disclosed which has built-in soft stop protection against excessive force. The piezoelectric device may, for example, take the form of a generator or a sensor.

In an example, a piezoelectric device includes a flexible cantilever arm in the form of a beam of piezoelectric material, a cantilever stop spring, and a cantilever stop spring landing pad. The device may, for example, be an electric generator or a piezoelectric sensor, such as an accelerometer. The device may have a lower cantilever stop spring landing pad and an upper cantilever stop spring landing pad. The arm may further include a lower flexible electrode, an upper flexible electrode, and a piezoelectric material bonded between portions of the lower flexible electrode and the upper flexible electrode, wherein the cantilever stop spring is formed from at least one of the lower flexible electrode or the upper flexible electrode.

DETAILED DESCRIPTION OF EXAMPLE EMBODIMENTS

Figure 1:
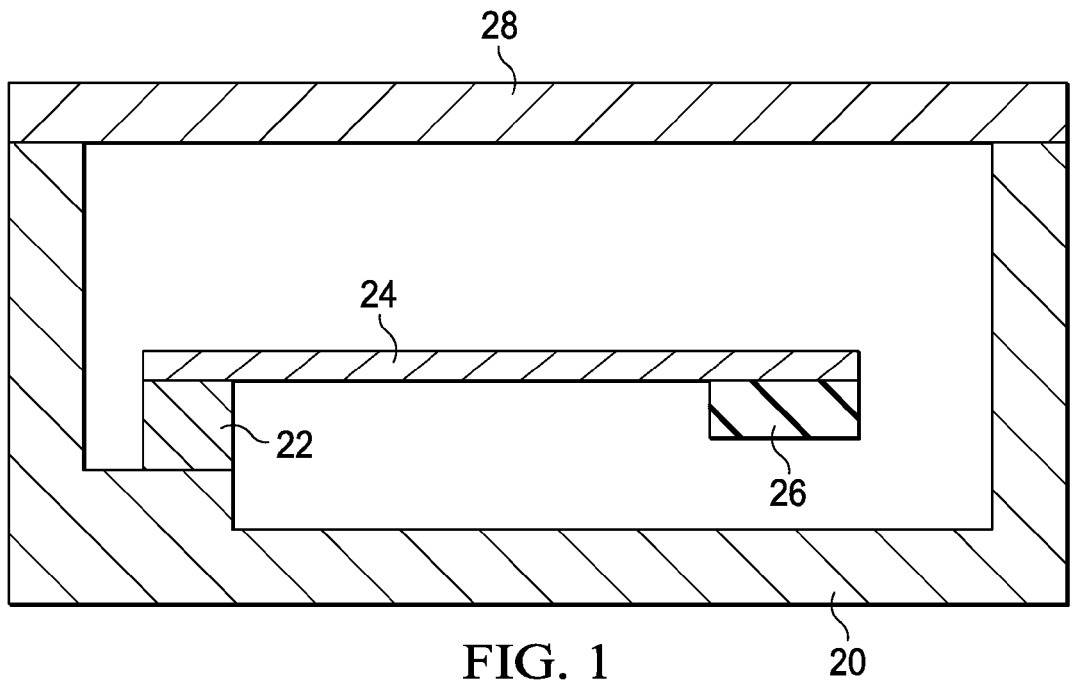
FIGS. 1 and 2 (Prior Art) illustrate examples of existing piezoelectric devices.
Figure 2:
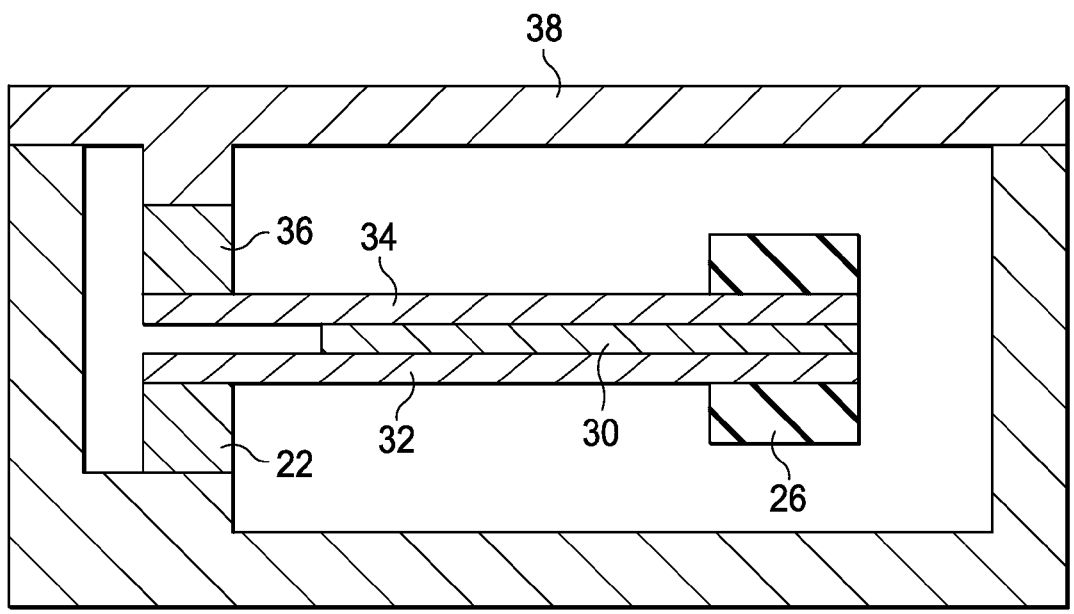
Figure 3:
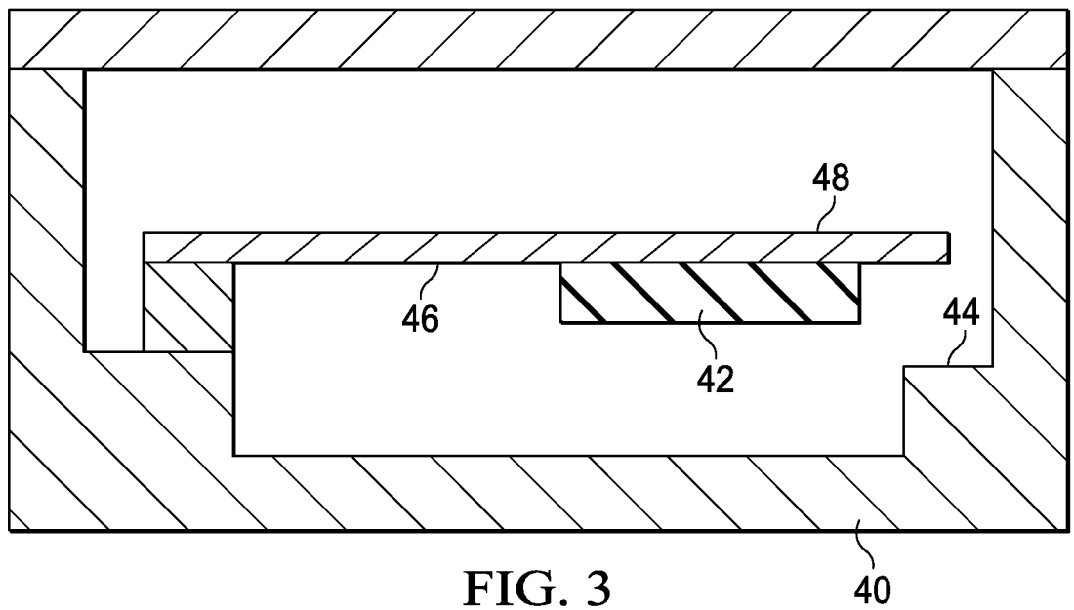
FIGS. 3-7 illustrate example piezoelectric devices formed according to principles of the invention.

FIG. 3 illustrates an embodiment of a cantilever piezoelectric device with built-in protection against failure if excessive stress is applied to the cantilever arm 46 as may occur when the piezoelectric device is dropped. In this embodiment, a portion of the cantilever arm 48 is extended beyond the proof mass 42 forming a cantilever motion stop spring 48. The cantilever material is formed of flexible material that bends when a force is applied. This bending stresses the piezoelectric material in the cantilever arm generating an electrical voltage. A cantilever motion stop spring landing pad 44 (hereafter referred to as landing pad) is formed in the device package 40. During an event when excessive force is applied, the cantilever stop spring 48 may come into contact with the landing pad 44, preventing the cantilever arm 46 from bending to the extent that it may be damaged. Since the cantilever stop spring is formed of a flexible material, it provides a soft stop when it comes into contact with the landing pad 44, when it flexes and absorbs some of the force thereby softening the shock.

Figure 4:
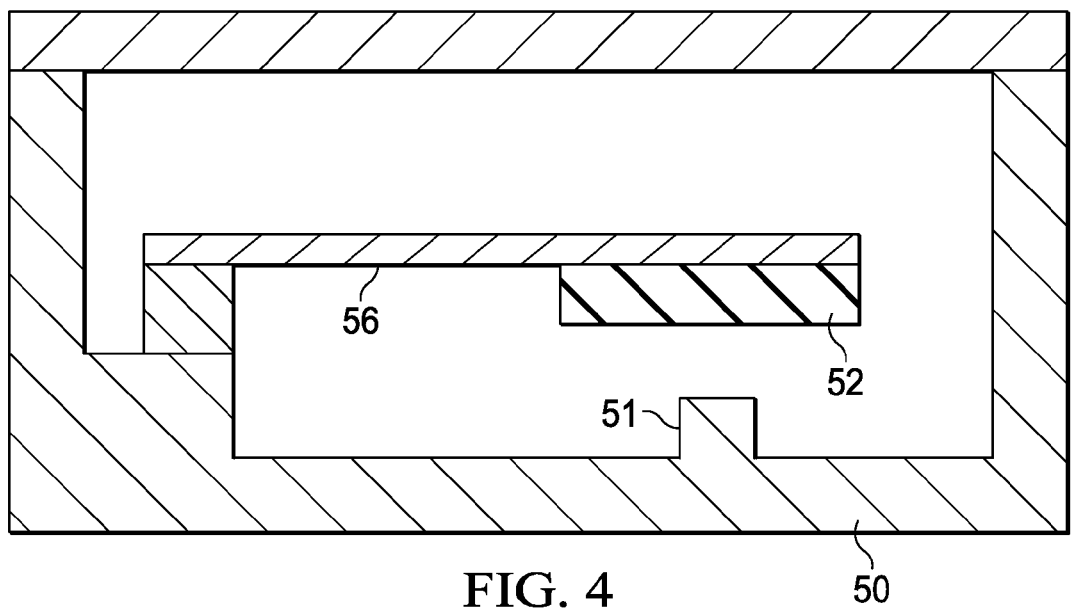

Alternatively, as shown in FIG. 4 a raised pedestal 51 of the package material may be formed under the proof mass 52 to limit the travel of the proof mass to protect the cantilever arm 56 from bending too far, but in this case the shock may be significantly increased because there is no give in either the proof mass 52 nor the package pedestal 51 when the proof mass 52 hits the package pedestal 51. This increased shock caused by this hard stop may cause the bond between the proof mass 52 and the cantilever arm 56 to fail for example.

Figure 5:
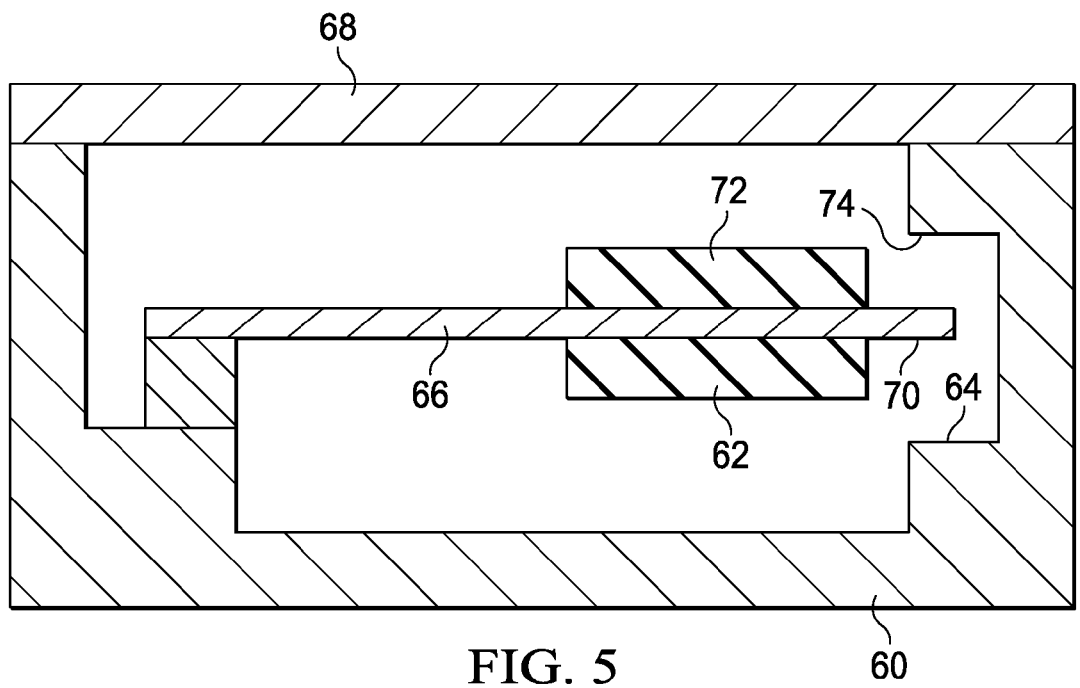

An alternative embodiment where proof masses are symmetrically placed both above 72 and below 62 the cantilever arm 70 is shown in FIG. 5. In this embodiment, a lower landing pad 64 and an upper landing pad 74 are formed in the package 60 or in the package 60 and package lid 68 as is shown in FIG. 5. As before, a portion of the cantilever arm 66 is extended beyond the proof masses 62 and 72 forming a cantilever stop spring 70. Since the cantilever arm 66 material is flexible, the travel of the cantilever is slowed by the spring action of the cantilever stop spring 70 before bringing the cantilever arm 66 to a full stop thus providing a soft stop which may prevent damage.

Figure 6:
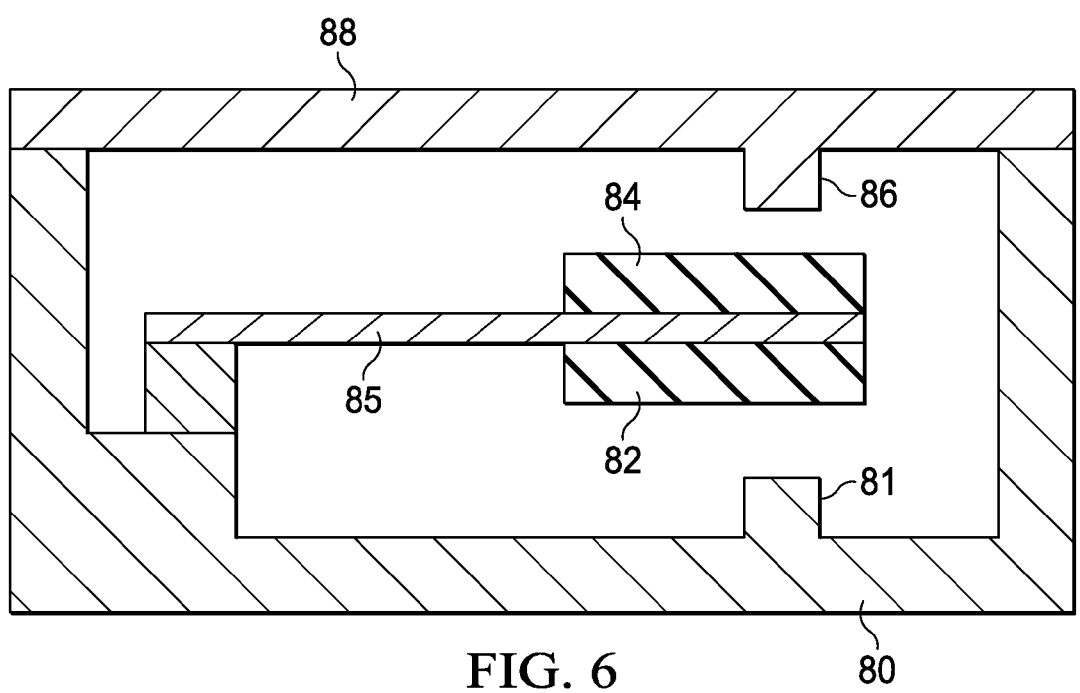

Alternatively, as shown in FIG. 6, pedestals 81 and 86 may be formed of package material in the package lid 88 and the package 80 to limit the travel of the proof masses 82 and 84 to protect the cantilever arm 85 from bending too far, but in this case the shock may be significantly increased because there is no give in either the proof masses 82 and 84, nor in the package pedestal 81 and 86 when the one of the proof masses hits on of the package pedestals. The increased shock caused by this hard stop may cause the bond between the proof masses 82 and 84 and the cantilever arm 85 to fail for example.

Figure 7:
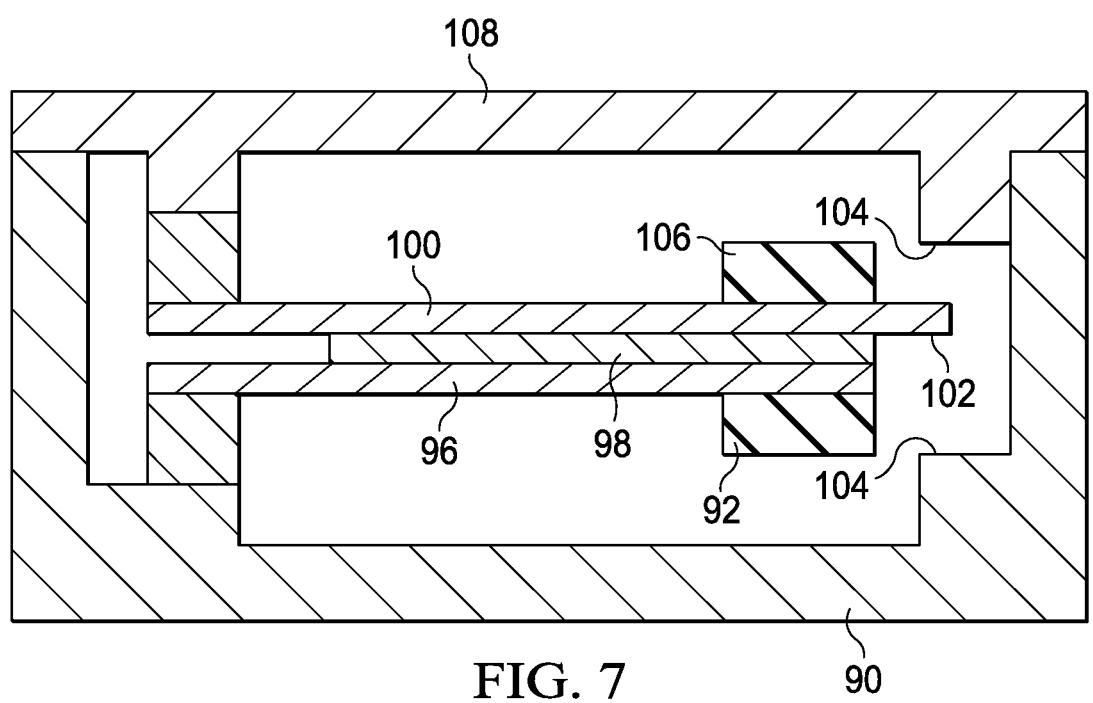

FIG. 7 illustrates an embodiment of a sandwich cantilever piezoelectric device with built-in protection against failure if excessive stress is applied to the cantilever arm as may occur when the piezoelectric device is dropped. In this piezoelectric device, the cantilever is a sandwich formed of flexible upper electrode 100 and flexible lower electrode 96 which may be thin metal. Typically, the flexible electrodes may be formed of one or more layers of metal such as gold, silver, platinum, palladium, copper, aluminum, titanium, or an alloy comprising one or more of such metals. Alternatively the flexible electrode may be formed of a silicon-based material such as silicon, polycrystalline silicon, or silicon nitride that is coated with a thin layer of metal. The piezoelectric material may include but is not limited to lead zirconate titanate, lead magnesium niobate-lead zirconate titanate, lead zirconate niobate-lead zirconate titanate, aluminum nitride, and zinc oxide. In this example embodiment, one of the flexible cantilever electrodes 100 is extended past the proof masses 92, 106 to form a cantilever stop spring 102. Upper and lower landing pads 104, 94 are formed in the package 90 or in the package 90 and the lid 108 as shown in FIG. 7. During an event of excessive stress, the cantilever stop spring 102 may come into contact with either the upper landing pad 104 or lower landing pad 94. When it does, spring 102 flexes and absorbs part of the shock providing a soft stop before bringing the sandwich cantilever arm to rest.

Alternatively, pedestals of package material may be formed below proof mass 92 and above proof mass 106 to limit the travel of the sandwich cantilever arm, but this is not a preferred embodiment since the shock of the hard stop when the cantilever arm hits the package material post may be significantly larger since there is no give in either the proof masses or the package pedestals when the proof mass hits one of the pedestals. This increased shock caused by the hard stop may result in the bonding failure between one the proof masses 92 and 106 and the electrodes 96 and 100, may result in a bonding failure between the piezoelectric material 98 and one of the flexible electrodes, 96 and 100 to fail, or may result in cracking of the piezoelectric material 98.

The described embodiments may be implemented with no additional processing steps during the manufacture and the packaging of the piezoelectric device. The reliability of the piezoelectric device is improved by these embodiments with no additional cost.

Those skilled in the art to which this invention relates will appreciate that many other embodiments and variations are possible within the scope of the claimed invention.

What is claimed is:

1. A device comprising:
   a flexible arm comprising a piezoelectric material which when flexed generates an electrical voltage;
   a support post mounting a first end of the flexible arm in cantilever position within a package;
   a proof mass attached to the flexible arm to increase an amount of flexing of the flexible arm when a force is applied to the package, a second end of the flexible arm extending beyond the proof mass and forming a cantilever motion stop spring, wherein the second end of the flexible arm is integrally formed with the flexible arm;
   a landing pad formed in the package in a position to enable unrestricted flexing of the flexible arm by relative oscillation of the second end about the first end under usual force application to the package during normal operation without the stop spring contacting the landing pad, and to provide shock absorbing spring contact between the stop spring and the landing pad thereby providing a soft stop for limiting travel of the second end during an event when an excessive force greater than usual force is applied to the package.

2. The device of claim 1, wherein the package includes a cavity having a contour with a main portion of given dimension within which the proof mass travels during normal operation and a stepped portion of reduced dimension within which the stop spring travels during normal operation; and wherein the landing pad comprises a step defining the stepped portion.

3. The device of claim 2, wherein the proof mass comprises a first proof mass attached to a top of the flexible arm between the first end and the second end, and a second proof mass attached opposite the first proof mass to a bottom of the flexible arm.

4. The device of claim 3, wherein the stepped portion is defined by oppositely facing first and second steps and the landing pad comprises a first landing pad formed by the first step providing a first soft stop for limiting travel of the second end in a direction, and a second pad formed by the second step providing a second soft stop for limiting travel of the second end in an opposite direction.

5. The device of claim 4, wherein the flexible arm comprises a flexible first member having the first end attached to the support post and the second end extending beyond the proof mass, and a piezoelectric material second member attached for flexing with the first member.

6. The device of claim 4, wherein the support post comprises
   oppositely directed first and second support posts;
   the flexible arm comprises flexible first and second electrode members having respective first ends attached to the first and second support posts and second ends, and a piezoelectric material member sandwiched between the first and second electrodes for flexing together therewith;
   the first proof mass is attached to a top of the first electrode member; the second proof mass is attached opposite the first proof mass to a bottom of the second electrode member; and
   at least one of the second ends of the first and second electrode members extends beyond the associated first or second proof mass.

7. The device of claim 6, wherein the electrode members comprise flexible metal members.

8. The device of claim 7, wherein the electrode members comprise one or more layers of gold, silver, platinum, palladium, copper, aluminum, titanium, or an alloy comprising one or more of such metals.

9. The device of claim 8, wherein the piezoelectric material comprises at least one of lead zirconate titanate, lead magnesium niobate-lead zirconate titanate, lead zirconate niobate-lead zirconate titanate, aluminum nitride or zinc oxide.

10. The device of claim 6, wherein the electrode members comprise a metal coated silicon-based material.

11. The device of claim 10, wherein the silicon-based material comprises silicon, polycrystalline silicon, or silicon nitride.

12. The device of claim 11, wherein the piezoelectric material comprises at least one of lead zirconate titanate, lead magnesium niobate-lead zirconate titanate, lead zirconate niobate-lead zirconate titanate, aluminum nitride or zinc oxide.

13. The device of claim 2, wherein the stepped portion is defined by oppositely facing first and second steps and the landing pad comprises a first landing pad formed by the first step providing a first soft stop for limiting travel of the second end in a direction, and a second pad formed by the second step providing a second soft stop for limiting travel of the second end in an opposite direction.

14. The device of claim 1, wherein the flexible arm comprises a flexible first member having the first end attached to the support post and the second end extending beyond the proof mass, and a piezoelectric material second member attached for flexing with the first member.

15. The device of claim 14, wherein the first member comprises a flexible metal electrode.

16. The device of claim 15, wherein the piezoelectric material comprises at least one of lead zirconate titanate, lead magnesium niobate-lead zirconate titanate, lead zirconate niobate-lead zirconate titanate, aluminum nitride or zinc oxide.

17. The device of claim 14, wherein the first member comprises a metal coated silicon-based material.

18. The device of claim 17, wherein the piezoelectric material comprises at least one of lead zirconate titanate, lead magnesium niobate-lead zirconate titanate, lead zirconate niobate-lead zirconate titanate, aluminum nitride or zinc oxide.

19. The device of claim 1, wherein the flexible arm is shaped to form a rectangular prism.

20. The device of claim 1, wherein the proof mass extends from a surface of the flexible arm that opposes a surface of the landing pad.

21. A device comprising:
- a flexible arm comprising a piezoelectric material which when flexed generates an electrical voltage;
- a support post mounting a first end of the flexible arm in cantilever position within a package;
- a proof mass attached to the flexible arm to increase an amount of flexing of the flexible arm when a force is applied to the package, a second end of the flexible arm extending beyond the proof mass and forming a cantilever motion stop spring;
- a landing pad formed in the package in a position to enable unrestricted flexing of the flexible arm by relative oscillation of the second end about the first end under usual force application to the package during normal operation without the stop spring contacting the landing pad, and to provide shock absorbing spring contact between the stop spring and the landing pad thereby providing a soft stop for limiting travel of the second end during an event when an excessive force greater than usual force is applied to the package;
- wherein the proof mass comprises a first proof mass attached to a top of the flexible arm between the first end and the second end, and a second proof mass attached opposite the first proof mass to a bottom of the flexible arm.

22. A device comprising:
- a flexible arm comprising a piezoelectric material which when flexed generates an electrical voltage;
- a support post mounting a first end of the flexible arm in cantilever position within a package;
- a proof mass attached to the flexible arm to increase an amount of flexing of the flexible arm when a force is applied to the package, a second end of the flexible arm extending beyond the proof mass and forming a cantilever motion stop spring;
- a landing pad formed in the package in a position to enable unrestricted flexing of the flexible arm by relative oscillation of the second end about the first end under usual force application to the package during normal operation without the stop spring contacting the landing pad, and to provide shock absorbing spring contact between the stop spring and the landing pad thereby providing a soft stop for limiting travel of the second end during an event when an excessive force greater than usual force is applied to the package;
- wherein the support post comprises oppositely directed first and second support posts;
- the flexible arm comprises flexible first and second electrode members having respective first ends attached to the first and second support posts and second ends, and a piezoelectric material member sandwiched between the first and second electrodes for flexing together therewith;
- the proof mass comprises a first proof mass attached to a top of the first electrode member, and a second proof mass attached opposite the first proof mass to a bottom of the second electrode member; and
- at least one of the second ends of the first and second electrode members extends beyond the associated first or second proof mass.

* * * * *